(12) United States Patent
Tatsumi et al.

(10) Patent No.: US 10,157,758 B2
(45) Date of Patent: Dec. 18, 2018

(54) WORK HEATING DEVICE AND WORK TREATMENT DEVICE

(75) Inventors: Yoshiaki Tatsumi, Kawasaki (JP); Megumu Kawae, Kawasaki (JP); Yasuyuki Temma, Kawasaki (JP); Toshifumi Sugawara, Kawasaki (JP)

(73) Assignee: CREATIVE TECHNOLOGY CORPORATION, Tokyo (JP)

(*) Notice: Subject to any disclaimer, the term of this patent is extended or adjusted under 35 U.S.C. 154(b) by 1071 days.

(21) Appl. No.: 13/976,294

(22) PCT Filed: Dec. 20, 2011

(86) PCT No.: PCT/JP2011/079478
§ 371 (c)(1),
(2), (4) Date: Jun. 26, 2013

(87) PCT Pub. No.: WO2012/090782
PCT Pub. Date: Jul. 5, 2012

(65) Prior Publication Data
US 2013/0277357 A1 Oct. 24, 2013

(30) Foreign Application Priority Data
Dec. 27, 2010 (JP) .................................. 2010-290201

(51) Int. Cl.
*H01L 21/67* (2006.01)
*H01L 21/683* (2006.01)
*H01L 21/687* (2006.01)

(52) U.S. Cl.
CPC .... *H01L 21/67103* (2013.01); *H01L 21/6833* (2013.01); *H01L 21/68785* (2013.01)

(58) Field of Classification Search
CPC ........... H01L 21/67103; H01L 21/6833; H01L 21/68785
(Continued)

(56) References Cited

U.S. PATENT DOCUMENTS 5,701,228 A * 12/1997 Ishii ..................... H01L 21/6831
361/234
8,525,418 B2 * 9/2013 Morita .............. H01L 21/67103
219/121.4
(Continued)

FOREIGN PATENT DOCUMENTS

JP 11-111829 A 4/1999
JP 11111829 A * 4/1999
(Continued)

OTHER PUBLICATIONS

Mamoru Kosakai, Electrostatic chuck device, PCT, 29 pages.*
(Continued)

*Primary Examiner* — Dana Ross
*Assistant Examiner* — Kuangyue Chen
(74) *Attorney, Agent, or Firm* — Birch, Stewart, Kolasch & Birch, LLP

(57) ABSTRACT

Provided are a work heating device which is capable of heating a work piece with high soaking properties as well as fine temperature control and which remains highly reliable over a long-term use by preventing the deformation or the like of a chuck member, and a work treating device that uses the work heating device. The work heating device is a work heating device in which the chuck member including a work attraction electrode for work attraction and a heater member including a heating element for work heating are layered, and which is capable of heating with the heater member the work piece stuck by attraction on the chuck member side, in which the heater member includes a chuck attraction electrode for causing the chuck member to stick by attraction, between a surface of the heater member that is opposed to the chuck member and the heating element, so that the chuck member and the heater member are layered detachably. The
(Continued)

work treating device is obtained by putting the work heating device on a base platform.

10 Claims, 2 Drawing Sheets

(58) Field of Classification Search
USPC .............................................. 219/443.1, 526
See application file for complete search history.

(56) References Cited

U.S. PATENT DOCUMENTS

| | | | |
|---|---|---|---|
| 2002/0092470 A1* | 7/2002 | O'Mara | B05B 5/032 118/629 |
| 2007/0103844 A1 | 5/2007 | Eguchi | |
| 2010/0156055 A1* | 6/2010 | Saito | H01L 21/67103 279/128 |
| 2010/0193491 A1* | 8/2010 | Cho | H01L 21/67103 219/158 |
| 2011/0005686 A1 | 1/2011 | Tanaka et al. | |
| 2011/0097133 A1* | 4/2011 | Duru | A45D 40/26 401/1 |
| 2011/0149462 A1* | 6/2011 | Kugimoto | H01L 21/6831 361/234 |
| 2012/0299253 A1* | 11/2012 | Kosakai | H01L 21/67103 279/128 |

FOREIGN PATENT DOCUMENTS

| | | | |
|---|---|---|---|
| JP | 11-265931 A | | 9/1999 |
| JP | 2003-124298 A | | 4/2003 |
| JP | 2003124298 A | * | 4/2003 |
| JP | 2004-55815 A | | 2/2004 |
| JP | 2005-347559 A | | 12/2005 |
| JP | 2007-129142 A | | 5/2007 |
| JP | 2010-109346 A | | 5/2010 |
| JP | 2010 216823 | * | 9/2010 |

OTHER PUBLICATIONS

"Double-Sided Electrical Chuck", IBM Technical Disclosure Bulletin, vol. 32, No. 5B, Oct. 1989, p. 35-36.

Extended European Search Report dated Feb. 20, 2015, for European Application No. 11853539.2.

The International Preliminary Report on Patentability (Forms PCT/IB/338 and PCT/IB/373) and the translation of the Written Opinion of the International Searching Authority (Form PCT/ISA/237), dated Jul. 11, 2013, for International Application No. PCT/JP2011/079478.

International Search Report issued in PCT/JP2011/079478, dated Mar. 13, 2012.

* cited by examiner

WORK HEATING DEVICE AND WORK TREATMENT DEVICE

TECHNICAL FIELD

The present invention relates to a work heating device and a work treating device and, more particularly, to a work heating device capable of heating a work piece such as a semiconductor wafer or a glass substrate while causing the work piece to stick by electric attraction force and a work treating device that uses the same.

BACKGROUND ART

The manufacture of a semiconductor device, a liquid crystal device, or the like requires forming a thin film on a work piece such as a semiconductor wafer or a glass substrate, and performing sputtering, etching, and other similar types of treatment on the work piece. In these types of treatment, the temperature of the work piece determines the film forming rate, the etching rate, and the like, thereby affecting the quality of the resultant thin film or the like significantly. For that reason, the forming of a thin film or other similar types of treatment is performed with the use of a unitary work heating device as in, for example, Patent Literature 1, where a attraction electrode for causing a work piece to stick by attraction and a resistance heating element are built in a ceramic or similar plate main body of the work heating device, and the heating element is energized and heated so that the stuck work piece reaches a desired temperature.

In such unitary work heating devices, it has been a common practice to manufacture the plate main body having the built-in attraction electrode and heating element by printing a given pattern on a ceramic green sheet in conductive ink having, as a main component, a high melting point metal such as tungsten, layering the ceramic green sheet and another ceramic green sheet, and sintering the layers simultaneously. However, in unitary work heating devices where components, including ceramic green sheets on which conductive ink is used for printing, are sintered at once, it is difficult to achieve uniformity in heating temperature throughout the entire surface of a work piece due to an error in the thickness of the heating element, an error in the distance from the heating element to the work piece, and the like. Patent Literature 2, for example, has therefore proposed a layered-structured work heating device in which a heating element is sandwiched between a attraction electrode-containing ceramic substrate which is sintered unitarily with a attraction electrode contained therein and a separately sintered ceramic substrate, and the two ceramic substrates are bonded with an adhesive.

Further, in recent years, along with the increase in the size of a semiconductor wafer, a glass substrate, and the like, it is increasingly important to maintain the temperature of a work piece uniformly with high precision. Ways to transmit heat uniformly have therefore been devised for layered-structured work heating devices as illustrated in FIG. 4, where a soaking plate 31 made from an aluminum plate or the like is interposed between a chuck member 1, which includes a attraction electrode 3 for work attraction, and heater member 5, which includes a heating element 7, so that heat from the heating element 7 is transmitted uniformly to the entire surface of a work piece 18.

However, the distance from the heating element 7 of the heater member to the work piece 18 is large in the structure that interposes the soaking plate 31 between the chuck member 1 and the heater member 5 because an adhesive layer 32 for layering these is included in the distance as well. Heat transmission to the work piece consequently takes that much longer time, and more different types of materials result in complicated work temperature control and difficulty in carrying out fine temperature control which affects the quality of a thin film or the like. On the other hand, the chuck member of a conventional layered-structured work heating device can be warped or bent, or even cracked in some cases, when the work heating device is in use for a long duration, which means that the lifespan of the chuck member determines the product lifespan of the work heating device itself.

CITATION LIST

Patent Literature

[PTL 1] JP 11-111829 A
[PTL 2] JP 2005-347559 A

SUMMARY OF INVENTION

Technical Problems

Under this situation, the inventors of the present invention have conducted an extensive study to solve the problems of conventional work heating devices, and have come to a knowledge that the deformation or the like of the chuck member originates from internal stress that is caused by a thermal expansion difference between the chuck member and the heater member. Therefore, the inventors of the present invention have found out that a layered structure in which the two are stuck by attraction via an electric force such as Coulomb's force prevents the deformation or the like of the chuck member and, in addition to solving this problem, enhances the response of work temperature control and improves soaking properties throughout the entire surface of a work piece even more owing to the eliminated need for an adhesive layer for fixing the two, thus completing the present invention.

An object of the present invention is therefore to provide a work heating device which is capable of heating a work piece with high soaking properties as well as fine temperature control and which remains highly reliable over a long-term use by preventing the deformation or the like of a chuck member, and a work treating device that uses the work heating device.

Solution to Problems

Specifically, according to the present invention, there is provided a work heating device in which a chuck member including a work attraction electrode for work attraction and a heater member including a heating element for work heating are layered, and which is capable of heating with the heater member a work piece stuck by attraction on the chuck member side, in which the heater member includes a chuck attraction electrode for causing the chuck member to stick by attraction, between a surface of the heater member that is opposed to the chuck member and the heating element, so that the chuck member and the heater member are layered detachably.

Further, according to the present invention, there is provided a work heating device in which a chuck member including a work attraction electrode for work attraction and a heater member including a heating element for work heating are layered, and which is capable of heating with the heater member a work piece stuck by attraction on the chuck member side, in which the chuck member includes a heater attraction electrode for causing the heater member to stick by attraction, between a surface of the chuck member that is opposed to the heater member and the work attraction electrode, so that the chuck member and the heater member are layered detachably.

Still further, according to the present invention, there is provided a work treating device including the above-mentioned work heating device, in which the work heating device is put on a base platform.

A feature of the work heating device of the present invention is that the chuck member which includes the work attraction electrode for work attraction and the heater member which includes the heating element for work heating are layered so that the members are attached to/detached from each other by electric attraction force. Specifically, electric attraction force is put into effect between the chuck member and the heater member to fix the two at least when the work heating device is in use, and is stopped when the work piece is not treated, such as before and after the work heating device is put into use, so that the chuck member and the heater member are easily detached from each other.

When forming such a work heating device, the following two structural examples can be employed in the present invention. First, the first structural example is a work heating device that has, on the heater member side, a chuck attraction electrode for causing a chuck member to stick by attraction. The second structural example is a work heating device that has, on the chuck member side, a heater attraction electrode for causing a heater member stick by attraction. In either case, the present invention creates a state where the chuck member and the heater member are stuck by attraction force that works in a vertical direction, without interposing an adhesive layer. Accordingly, even when a thermal expansion difference generates a force that expands and shrinks in a horizontal direction, the chuck member and the heater member can slide in the horizontal direction, thereby lessening the warping or the like of the chuck member and the heater member.

Note that, in order to layer the chuck member and the heater member by electric attraction force, theoretically, it is conceivable to use attraction force exerted on the rear side of a work attraction electrode (a surface opposite from the work piece) in the chuck member. However, this causes inconveniences in the operation of treating a work piece because releasing a stuck work piece by cutting off a voltage that has been applied to the work attraction electrode also removes attraction force that holds the chuck member and the heater member together. It is why in the present invention the chuck attraction electrode or heater attraction electrode described above is provided separately from the work attraction electrode. The chuck attraction electrode and the heater attraction electrode may be used in combination, but any one of the two is sufficient in terms of function.

First, in the first structural example which has on the heater member side the chuck attraction electrode for causing the chuck member to stick by attraction, the chuck attraction electrode is provided between a surface opposed to the chuck member and a heating element. Among those components, the chuck attraction electrode is not limited to a particular material, forming means, and the like as long as the chuck member can be stuck by attraction to the chuck attraction electrode by an electric attraction force such as Coulomb's force, Johnsen-Rahbek force, or a gradient force. For instance, the chuck attraction electrode may be formed by etching metal foil into a given shape, or by other known methods such as sputtering, ion plating, thermal spraying of a metal material, or printing that uses conductive ink.

The chuck attraction electrode can be any of the so-called unipolar type and bipolar type, and a suitable pattern shape can be chosen, for example, a flat board shape, a semi-circular shape, a comb-tooth shape, or a mesh pattern. However, a chuck attraction electrode that is preferred from the viewpoint of the level of attraction force exerted over the chuck member, and the simplification of the device structure in terms of voltage application, is a bipolar type chuck attraction electrode in which electrode portions formed in given patterns are staggered so that an electric potential difference is created between the electrode portions. Further, in order to facilitate the attachment/detachment of the heater member and the chuck member to/from each other, it is preferred for the chuck attraction electrode to include a connection terminal that has an ON/OFF switch and that can connect to an external voltage source, or to be capable of connecting to an external voltage source via an ON/OFF switch. Note that, the thickness of the chuck attraction electrode is not particularly limited. Considering the resultant distance from the heating element to the work piece and other factors, however, a desired thickness of the chuck attraction electrode is about 25 μm or more and 100 μm or less.

Further, a favored heating element in the heater member is a resistance heating element which generates heat when energized. For instance, the heating element employed can be a known one that is a metal wire, or a metal plate or metal foil used as it is, or a metal plate or metal foil formed in a given pattern by etching, or one that is formed by printing with the use of conductive ink. As is the case for the chuck attraction electrode, it is preferred for the heating element to include a connection terminal that has an ON/OFF switch and that can connect to an external voltage source, or to be capable of connecting to an external voltage source via an ON/OFF switch. The heating element may also be divided into a plurality of pieces so that the temperature of a work piece can be controlled for each given area separately. In this case, it is recommended to provide the heating elements of the respective areas with individual connection terminals or allow the heating elements to connect to an external voltage source.

Further, while the heating element is sandwiched between at least two dielectric substances in a favored heater member, the heater member of the first structural example further needs to have a structure in which the chuck attraction electrode is included between a surface of the heater member that is opposed to the chuck member and the heating element. The chuck attraction electrode can be in any place between the surface opposed to the chuck member and the heating element. Considering the work heating response and other factors, however, the distance between the heating element and the chuck attraction electrode is desired to be 25 μm or more and 100 μm or less, and is preferred to be 25 μm or more and 50 μm or less.

The heater member is formed so as to have the structure described above in which the heating element is sandwiched by known dielectric substances, for example, insulative resin films made of polyimide, polyethylene terephthalate (PET), or the like, ceramic plates, or ceramic thermal spray films formed by the thermal spraying of ceramic powder such as alumina powder, aluminum nitride powder, and zirconia powder, and the chuck attraction electrode is placed in a given place. In this case, the dielectric substances used to form the heater member may be made from the same material, or may be two or more different types of dielectric substances. Further, a bonding sheet, an adhesive, or the like may be used to form the heater member. Note that, the thickness of the heater member which varies depending on what type of dielectric substance is used is not particularly limited. However, considering that the work heating device is used put on a base platform and utilizes a cooling mechanism provided by the base platform as described later, the total thickness including the heating element and the chuck attraction electrode is desirably about 0.2 mm or more and 0.7 mm or less.

Further, the chuck member in the first structural example only needs to have on one side a work attraction surface to which a work piece is stuck by electric attraction force whereas a surface of the chuck member on the other side is stuck by attraction to the chuck attraction electrode which is included in the heater member. In a favored chuck member structure, the work attraction electrode is sandwiched therein between at least two dielectric substances.

The dielectric substances used herein are known ones such as those listed in the description of the forming of the heater member, and a bonding sheet, an adhesive, or the like may be used if necessary. The work attraction electrode, too, can be formed from known materials such as those listed in the description of the forming of the chuck attraction electrode. The shape of the work attraction electrode can be designed suitably while selecting the unipolar type or the bipolar type based on the type, size, and the like of a work piece to be stuck by attraction to the work attraction electrode. Further, the thickness of the chuck member is not particularly limited. Considering the distance from the heating element of the heater member to the work piece, however, the thickness of the chuck member is desirably about 120 µm or more and 300 µm or less.

Next, in the second structural example, the chuck member and the heater member are detachably layered so that the heater attraction electrode for causing the heater member to stick by attraction is provided between a surface of the chuck member that is opposed to the heater member and the work attraction electrode. The heater attraction electrode can be any electrode that can cause the heater member to stick by electric attraction force, and can employ the materials, shapes, and others listed in the description of the chuck attraction electrode in the first structural example. The descriptions about providing the connection terminal and about the thickness of the heater attraction electrode also apply to the heater attraction electrode. Further, the heater attraction electrode can be in any place between the surface opposed to the heater member and the work attraction electrode. Considering the work heating response and other factors, however, the distance between the work attraction electrode and the heater attraction electrode is desired to be 25 µm or more and 100 µm or less, and is preferred to be 25 µm or more and 50 µm or less.

The chuck member in the second structural example can be the chuck member in the first structural example except that the heater attraction electrode is provided as described above. The thickness of the chuck member in the second structural example including the heater attraction electrode is desirably about 0.2 mm or more and 1 mm or less. The heater member, on the other hand, can be the same as the one in the first structural example except that the chuck attraction electrode is eliminated, and desirably has a thickness of about 0.1 mm or more and 0.3 mm or less.

A favored work heating device in the present invention is put on a base platform which has, on the inside, a conduit for flowing a medium such as gas or liquid, to be used as a work treating device. Temperature control more suitable for treatment that is being performed on a work piece at the time is accomplished through a combination of heating by the heater member and a cooling effect of letting the medium flow inside the base platform.

Further, it is preferred for the heater member to have a through hole leading to a gas hole in the base platform, which has, on the inside, a conduit for flowing a gas medium and which has, in the front surface, the gas hole connected to the conduit. In other words, the heater member and the chuck member in the present invention pull each other by electric attraction force, instead of being fixedly adhered to each other by an adhesive layer. Providing the through hole that pierces the front and rear surfaces of the heater member causes the gas medium supplied from the base platform side to stay at the boundary between the heater member and the chuck member, thereby generating attraction, because there are microscopic surface irregularities at least in the boundary between the heater member and the chuck member due to the surface roughness of the dielectric substances (the chuck attraction electrode or the heater attraction electrode in some cases). The gas present at the attraction boundary is an excellent medium of heat and the action thereof is particularly noticeable in cases such as treating a work piece in a vacuum state, where the function of the gas at the attraction boundary is equal to or greater than that of an aluminum plate or the like that is conventionally used as a soaking plate. As a matter of course, a gas groove for the gas medium may be formed in one or both of the heater member and the chuck member. Alternatively, a through hole may be formed in the chuck member as well to be joined to the through hole of the heater member so that the gas medium stays at the boundary between the work piece and the chuck member.

Further, the work heating device can be put on the base platform by fixing the work heating device to the base platform with the use of a bonding sheet or an adhesive. In a preferred mode, a base attraction electrode for causing the base platform to stick by attraction is provided between a surface of the heater member that is opposed to the base platform and the heating element, or a attraction sheet made from a resin material is provided on the surface of the heater member that is opposed to the base platform, so that the work heating device is put on the base platform in a detachable manner.

In this case, when the base attraction electrode is used, known materials and the like can be used to form the base attraction electrode as is the case for the chuck attraction electrode and heater attraction electrode described above, and a preferred base attraction electrode is provided with a connection terminal or electrically connectable otherwise.

On the other hand, when the attraction sheet is used, on the other hand, the attraction sheet is desired to be made from a resin material having an elasticity modulus of 0.5 MPa or more and 10 MPa or less and a three-dimensional average surface roughness (SRa) of 0.01 µm or more and 0.55 µm or less. A preferred attraction sheet has an elasticity modulus of 2 MPa or more and 3 MPa or less and a three-dimensional average surface roughness of 0.4 µm or more and 0.5 µm or less. It is presumed that one of reasons that such a attraction sheet made from a resin material can be stuck by attraction to the base platform in a detachable manner relates to the intermolecular force (van der Waals force). The inventors of the present invention have found out that a resin material that has the elasticity modulus and three-dimensional average surface roughness given above is generally effective for a base platform that is a metal platform made from an aluminum alloy or the like. Specific examples of the resin material may include a silicone resin, a styrene-butadiene rubber, a chlorosulfonated polyethylene rubber, an acrylonitrile-butadiene rubber, an ethylene-propylene rubber, a chloroprene rubber, a butadiene rubber, a fluororubber, an isobutylene-isoprene rubber, and a urethane rubber. Of those, a silicone resin is suitable.

Advantageous Effects of Invention

In the work heating device of the present invention which is structured so that the chuck member and the heater member are layered by electric attraction force, internal stress that causes warping, deformation, or the like in these members is prevented even when a thermal expansion difference is created between the heater member and the chuck member due to the heating of the heater member. The work heating device accordingly maintains high reliability over a long-term use. In addition, because the layer structure itself is simplified with the elimination of an adhesive layer between the chuck member and the heater member, the work heating device has a quicker heat response to a work piece. Heat from the heater member is transmitted efficiently and uniformly to a work piece and the temperature of the work piece can be controlled finely particularly when a given through hole is provided in the heater member so that a gas medium supplied while the work heating device is used put on a base platform from the base platform side stays at the boundary between the chuck member and the heater member.

Further, the work heating device of the present invention is further capable of freely attaching/detaching the chuck member and the heater member to/from each other by turning voltage application on/off, independently of the attachment/detachment of a work piece and the chuck member to/from each other. The work heating device can thus perform work treatment in a semiconductor manufacturing device or the like without inconveniences, and is also convenient for maintenance because replacing parts when, for example, the chuck member is worn, is easy.

DESCRIPTION OF EMBODIMENTS

A work heating device according to preferred embodiments of the present invention is described below with reference to the accompanying drawings.

First Embodiment

Figure 1:
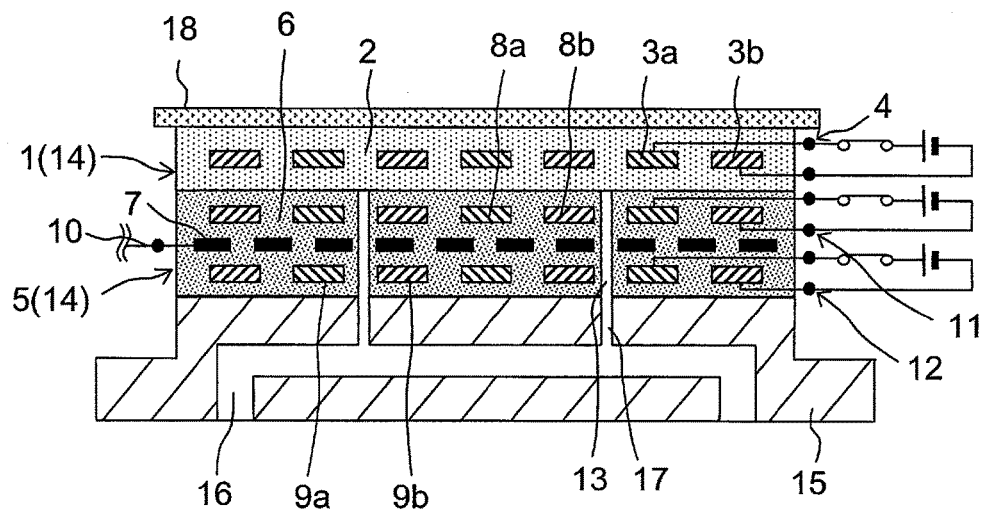
FIG. 1 is a schematic sectional view illustrating how a work heating device of a first structural example of the present invention is put on a base platform and used as a work treating device.
Figure 2:
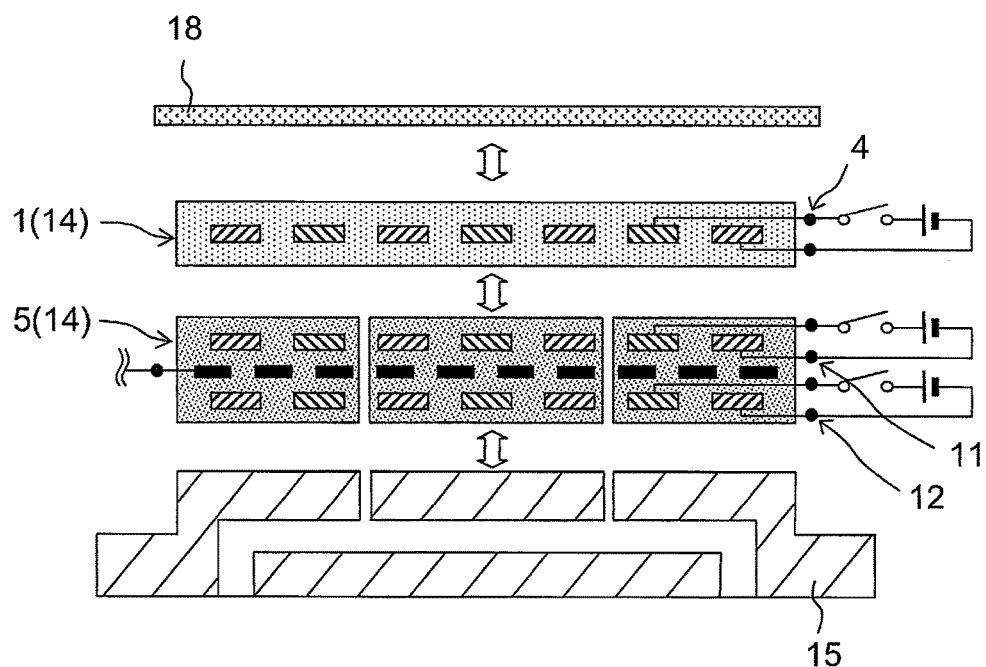
FIG. 2 is a schematic sectional view illustrating how members are detached from each other for cases such as the maintenance of the work treating device of FIG. 1.

FIGS. 1 and 2 illustrate a work treating device that can be applied to a plasma etching device which uses plasma for the plasma etching of a semiconductor substrate, or a similar device. In this work treating device, a work heating device 14 which includes a chuck member 1 and a heater member 5 is put on a base platform 15 which has, on the inside, a conduit 16 for flowing gas and which is made from an aluminum alloy. A work piece 18 such as a semiconductor substrate is stuck by attraction to the chuck member side of the work heating device 14 in order to conduct given treatment, for example, plasma etching, while keeping the work piece 18 at a temperature suitable for plasma treatment.

Among those components, the chuck member 1 is structured so that a work attraction electrode 3 for work attraction is included inside a dielectric substance 2. The chuck member 1 is suited to the shape of a work piece to be treated, and is formed with the use of, for example, two disc-shaped ceramic plates (e.g., A-479, a product of KYOCERA Corporation) which are made of alumina and each have a thickness of about 0.1 mm to 5 mm. The work attraction electrode 3 is formed on one of the ceramic plates by performing the vapor deposition of copper through a given mask and forming a copper layer to a thickness of about 0.1 mm to 50 µm. The ceramic plate is bonded to the other ceramic plate via an epoxy adhesive or the like. The first embodiment of the present invention is an example in which the bipolar type work attraction electrode 3 is formed. In the first embodiment, comb tooth-shaped electrode portions 3a and 3b are staggered, and a connection terminal 4 which has a switch and which can be connected to an external voltage source is included to apply a direct current voltage between these electrode portions (3a and 3b).

Further, the heater member 5 is structured so as to include a heating element 7, a chuck attraction electrode 8, and a base attraction electrode 9. The heating element 7 for work heating is provided inside a dielectric substance 6. The chuck attraction electrode 8 for causing the chuck member 1 to stick by attraction is provided between a surface of the heater member 5 that is opposed to the chuck member 1 and the heating element 7. The base attraction electrode 9 for causing the base platform 15 to stick by attraction is provided between a surface of the heater member 5 that is opposed to the base platform 15 and the heating element 7.

An example of forming this heater member is given. First, the base attraction electrode 9 is formed on one side of a polyimide film having a thickness of about 25 µm to 125 µm by the same method that is used to form the work attraction electrode 3 in the chuck member 1. An epoxy adhesive is applied to the base attraction electrode side to bond a polyimide film (e.g., Kapton H, a product of DU PONT-TORAY CO., LTD. or UPILEX, a product of Ube Industries, Ltd.) having a thickness of about 25 µm to 125 µm by thermal compression. Next, conductive ink such as silver filler ink is used to form by printing the resistance heating element 7 to a thickness of about 5 µm to 30 µm on the remaining surface of the polyimide film on which the base attraction electrode 9 has been formed. A polyimide film having a thickness of about 25 µm to 125 µm is bonded to the resistance heating element 7 via an epoxy adhesive by thermal compression. Further, on a surface of this polyimide film, the chuck attraction electrode 8 is formed by the same method that is used to form the work attraction electrode 3. Another polyimide film having a thickness of about 25 µm to 125 µm is bonded to the chuck attraction electrode 8 via an epoxy adhesive by thermal compression. Lastly, a disk shape is cut out of the layers. In the first embodiment, the chuck attraction electrode 8 and the base attraction electrode 9 respectively include a connection terminal 11 and a connection terminal 12 as in the work attraction electrode 3.

Further, the heating element 7 is suited to the shape of a work piece and has, for example, a whirlpool shape in plan view. The heating element 7 includes a connection terminal 10 which can connect to an external voltage source (not shown). Further, in the first embodiment, the base platform 15 has, in the front surface, a gas hole 17 leading to the conduit 16, and a through hole 13 which pierces the front surface and rear surface of the heater member 5 is formed in the heater member 5 to be connected to the gas hole 17.

In the case where the work treating device of the first embodiment is used in, for example, the plasma etching of a silicon substrate that is twelve inches in diameter with the use of a plasma etching device, the heater member 5 is put on the base platform 15 as illustrated in FIG. 1, and a direct current voltage of about 500 V to 2,000 V is applied to the base attraction electrode 9 so that the heater member 5 is stuck by attraction to the base platform 15. Further, the chuck member 1 is laid on top of the heater member 5, and a direct current voltage of about 500 V to 2,000 V is applied to the chuck attraction electrode 8 so that the chuck member 1 is stuck by attraction to the heater member 5. Further, a silicon substrate is put with the front surface of the chuck member 1 as a work attraction surface, and a direct current voltage of about 500 V to 2,000 V is applied to the work attraction electrode 3 so that the silicon substrate is stuck by attraction. When the silicon substrate is subjected to etching, the interior of a work treatment chamber of the plasma etching device is set to vacuum settings around $10^{-1}$ Pa to $10^{-5}$ Pa, and the silicon substrate is set to a given temperature from −80° C. to 250° C.

The silicon substrate is heated at this point with heat generated by energizing the heating element 7, and a gas medium supplied from the base platform 15 side stays at the boundary between the chuck member 1 and the heater member 5 because the alumina ceramic plates constituting the chuck member 1 and the polyimide films constituting the heater member 5 have a given level of surface roughness themselves. The heat generated by the heater member 5 thus uniformly heats the entire surface of the silicon substrate through the chuck member 1 via the gas medium.

After the work treatment is finished, the work piece stuck by attraction to the chuck member 1 can be released by stopping voltage application to the work attraction electrode 3 by, for example, switching off the switch for the external voltage source that is connected to the work attraction electrode 3 of the check member 1. Further, in the case where the need for maintenance or the like arises, as illustrated in FIG. 2, the chuck member 1 and the heater member 5 can easily be detached from each other by stopping voltage application by, for example, switching off the switch for the external voltage source that is connected to the chuck attraction electrode 8 of the heater member 5. Further, the heater member 5 and the base platform 15 can easily be detached from each other by stopping voltage application by, for example, switching off the switch for the external voltage source that is connected to the base attraction electrode 9.

Second Embodiment

Figure 3:
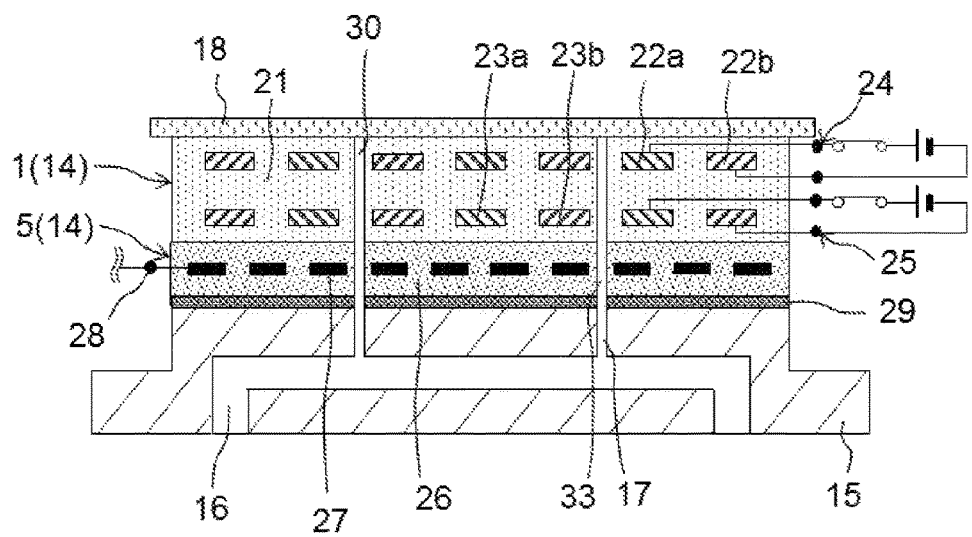
FIG. 3 is a schematic sectional view illustrating how a work heating device of a second structural example of the present invention is put on a base platform and used as a work treating device.
Figure 4:
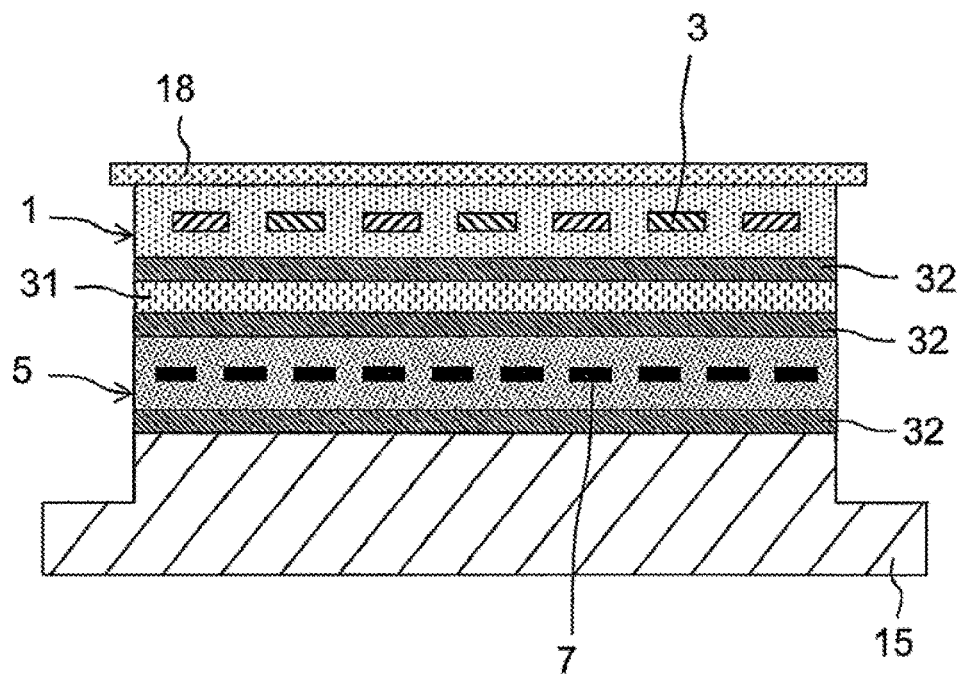
FIG. 4 is a schematic sectional view illustrating a conventional layered-structured work heating device.

FIG. 3 illustrates a work treating device that uses a modification example of the work heating device of the present invention. In the work treating device according to a second embodiment of the present invention, the work heating device 14 which includes the chuck member 1 and the heater member 5 is put on the base platform 15 which is made from an aluminum alloy via a attraction sheet 29 which is bonded on the heater member side.

Among those components, the chuck member 1 is structured so that a work attraction electrode 22 for work attraction and a heater attraction electrode 23 for causing the heater member 5 to stick by attraction are provided inside a dielectric substance 21. Among those components, the heater attraction electrode 23 is placed between a surface of the chuck member 1 that is opposed to the heater member and the work attraction electrode 22. This chuck member 1 is formed by, for example, preparing a ceramic plate made of alumina having one surface on which the work attraction electrode 22 is formed through the vapor deposition of copper as in the first embodiment, and a ceramic substrate made of alumina having one surface on which the heater attraction electrode 23 is formed through the vapor deposition of copper. The layers are bonded by an epoxy adhesive or the like so that the alumina ceramic plates are sandwiched between these attraction electrodes. The work attraction electrode 22 and the heater attraction electrode 23 have the same shapes and the like as those in the first embodiment, and respectively include a connection terminal 24 and a connection terminal 25 each having a switch and connectable to an external voltage source.

Further, the heater member 5 is obtained the same way as in the first embodiment except that only a heating element 27 for work heating is provided inside a dielectric substance 26. The heating element 27 includes a connection terminal 28 which can be connected to an external voltage source (not shown). Further, the attraction sheet 29 that is made from, for example, a silicone resin manufactured by Fuso Rubber Co., Ltd. (product name: Silius, elasticity modulus: 2.7 MPa, three-dimensional average surface roughness (SRa): 0.46 μm) is bonded to a surface of the heater member 5 that is opposed to the base platform 15.

Further, in the second embodiment, the base platform 15 has, in the front surface, the gas hole 17 leading to the conduit 16, and a through hole 33 which pierces the front surface and rear surface of the heater member 5 is formed in the heater member 5 to be connected to the gas hole 17 of the base platform 15. A through hole 30 which pierces the front surface and rear surface of the chuck member 1 is formed in the chuck member 1 to be connected to the through hole 33.

The work treating device in the second embodiment can be used in a plasma etching device or the like in the manner described in the first embodiment. Further, to conduct maintenance work or the like after the work treating device is used, the chuck member 1 and the heater member 5 can easily be detached from each other by stopping voltage application by, for example, switching off the switch for the external voltage source connected to the heater attraction electrode 23 of the chuck member 5. The heater member 5 and the base platform 15 which are stuck by attraction by the attraction sheet 29 alone can also easily be pulled apart from each other by hand.

INDUSTRIAL APPLICABILITY

The work heating device of the present invention is capable of heating a work piece to a given temperature while causing the work piece to stick by attraction. When put on a base platform to serve as a work treating device, the work heating device is particularly suitable for the treatment of a semiconductor substrate, a glass substrate, or the like in a semiconductor manufacturing device, for example, a plasma etching device. Other than this, the work heating device can be used for various types of work treatment, such as causing a work piece to stick by attraction and heating the work piece to a given temperature by itself.

REFERENCE SIGNS LIST

1: chuck member
2, 6, 21, 26: dielectric substance
3, 22: work attraction electrode
3a, 3b, 8a, 8b, 9a, 9b, 22a, 22b: electrode portion
4, 10, 11, 12, 24, 25, 28: connection terminal
5: heater member
7, 27: heating element
8: chuck attraction electrode
9: base attraction electrode
13, 30, 33: through hole
14: work heating device
15: base platform
16: conduit
17: gas hole
18: work piece
23: heater attraction electrode
29: attraction sheet
31: soaking plate
32: adhesive layer

The invention claimed is:

1. A work heating device comprising:
a chuck member comprising a work attraction electrode for generating work attraction, the chuck member having an upper surface, to which a work piece is attracted by the work attraction generated by the work attraction electrode and a bottom surface contacting an upper surface of a heat member; and
the heater member comprising a chuck attraction electrode for causing the chuck member to stick by attraction and a heating element for work heating, wherein
the chuck member is disposed on the heater member so that the heater member is capable of heating with the heating element, the work piece stuck by attraction on the upper surface of the chuck member,
the chuck attraction electrode of the heater member is disposed between a surface of the heater member that faces to the chuck member and the heating element, so that the chuck member is disposed on the heater member detachably,
a thickness of the chuck member is 120 μm to 300 μm, and a thickness of the heater member is 0.2 mm to 0.7 mm.

2. The work heating device according to claim 1, wherein the work heating device is disposed on a base platform with the heater member facing to the base platform, the base platform comprising therein a conduit for flowing a gas medium and comprising in a front surface, a gas hole which connects to the conduit,
wherein the heater member comprises a through hole that leads to the gas hole of the base platform, and
wherein the heater member and the chuck member are layered so that the gas medium supplied from the base platform side stays at a boundary between the heater member and the chuck member.

3. The work heating device according to claim 2, wherein the heater member is disposed on the base platform detachably by providing a base attraction electrode for causing the base platform to stick by attraction between a surface of the heater member that faces to the base platform and the heating element, or by providing an attraction sheet that is made from a resin material on the surface of the heater member that faces to the base platform.

4. The work heating device according to claim 3, wherein the attraction sheet is made from a resin material that has an elasticity modulus of 0.5 MPa or more and 10 MPa or less and a three-dimensional average surface roughness (SRa) of 0.01 μm or more and 0.55 μm or less.

5. A work treating device comprising the work heating device according to claim 1, wherein the work heating device is disposed on a base platform.

6. The work heating device according to claim 1, wherein the chuck member is disposed on the heater member without interposing an adhesive layer between the chuck member and the heater member.

7. The work heating device according to claim 1, wherein the chuck member is directly disposed on the heater member.

8. The work heating device according to claim 1, wherein the work heating device is disposed on a base platform with the heater member facing to the base platform, the base platform comprising therein a conduit for flowing a gas medium and comprising in a front surface, a gas hole which connects to the conduit,
wherein the heater member comprises a through hole that leads to the gas hole of the base platform,
wherein the heater member and the chuck member are layered so that the gas medium supplied from the base platform side stays at a boundary between the heater member and the chuck member,
wherein the heater member is disposed on the base platform detachably by providing a base attraction electrode for causing the base platform to stick by attraction between a surface of the heater member that faces to the base platform and the heating element, or by providing an attraction sheet that is made from a resin material on the surface of the heater member that faces to the base platform, and
wherein the chuck member is directly disposed on the heater member without interposing an adhesive layer between the chuck member and the heater member.

9. The work heating device according to claim 1, wherein the heater member is formed of layered polyimide films, the chuck attraction electrode, and the heating element, and
the chuck attraction electrode and the heating element are disposed between said polyimide films, and the heating element and polyimide films are isolated from each other by at least one of said polyimide films.

10. The work heating device according to claim 8, wherein the heater member is formed of layered polyimide films, the chuck attraction electrode, and the heating element, and
the chuck attraction electrode and the heating element are disposed between said polyimide films, and the heating element and polyimide films are isolated from each other by at least one of said polyimide films.

* * * * *